(12) United States Patent
Tilly et al.

(10) Patent No.: US 6,236,072 B1
(45) Date of Patent: May 22, 2001

(54) METHOD AND SYSTEM FOR EMITTER PARTITIONING FOR SIGE RF POWER TRANSISTORS

(75) Inventors: Lars Tilly, Malmö ; Per-Olof Magnus Brandt, Staffanstorp, both of (SE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 0 days.

(21) Appl. No.: 09/189,804

(22) Filed: Nov. 12, 1998

(51) Int. Cl.[7] ............ H01L 27/082; H01L 27/102; H01L 29/70; H01L 31/11

(52) U.S. Cl. ............ 257/197; 257/560; 257/563; 257/578; 257/579; 257/580; 438/312; 438/342

(58) Field of Search .................. 257/560, 579, 257/580, 578, 197, 563; 438/342, 312

(56) References Cited

U.S. PATENT DOCUMENTS

| | | | |
|---|---|---|---|
| 4,654,687 | 3/1987 | Hébert | 357/34 |
| 4,982,262 * | 1/1991 | Hartman et al. | 357/46 |
| 5,099,298 * | 3/1992 | Nakamura et al. | 357/27 |
| 5,200,803 * | 4/1993 | Leduc | 257/560 |
| 5,341,020 | 8/1994 | Sasahara | 257/578 |
| 5,387,813 * | 2/1995 | Iranmanesh et al. | 257/563 |
| 5,455,186 | 10/1995 | Inn | 437/31 |
| 5,723,897 | 3/1998 | Leighton et al. | 257/563 |

OTHER PUBLICATIONS

Joachim N. Burghartz, et al., "SiGe Power HBT's for Low-Voltage, High-Performance RF Applications," IEEE Electronics Device Letters, vol. 19, No. 4, Apr. 1998, pp. 103–105, XP–000738788.

* cited by examiner

*Primary Examiner*—William Mintel
(74) *Attorney, Agent, or Firm*—Burns, Doane, Swecker & Mathis, L.L.P.

(57) ABSTRACT

A power transistor includes a plurality of emitter regions and a plurality of base contacts. In order to decrease base resistance, each of the plurality of emitter regions is adjacent to at least four base contacts. The entire transistor includes multiple emitter regions, e.g., greater than or equal to about 1,000 with no upper limit wherein the actual number of emitter regions is dependent on the desired current carrying capacity. The emitter regions are directly connected in parallel to the high current carrying metal layer of the transistor through vias or metal contact studs. The size of the emitter regions should be made as small as the process design rules will allow in order to allow an increase in the perimeter to area ratio of the emitter region which, for a given current, decreases the peak current density.

11 Claims, 2 Drawing Sheets

METHOD AND SYSTEM FOR EMITTER PARTITIONING FOR SIGE RF POWER TRANSISTORS

TECHNICAL FIELD

The present invention relates to a vertical bipolar transistor and to a method of manufacturing a bipolar power transistor, said power transistors being primarily intended for high frequency applications, especially radio frequency applications.

STATE OF THE ART

Bipolar transistors for power amplification at high frequencies must, for a given supply voltage and operation frequency, fulfil a large number of detailed requirements concerning power amplification, ruggedness, breakdown voltage, noise, distortion, capacitance, input and output impedance, etc. The operation frequencies for modern telecommunications electronics vary from a few hundred MHz to several tens of GHz. Power transistors operate at high signal levels and high power densities where several components connected in parallel in a casing may be used.

The semiconductor material most frequently used for bipolar power transistors, at least at frequencies below 3 GHz, is silicon. A collector layer is epitaxially deposited on the substrate, and by subsequent, repetitive action of oxidation, lithography, etching, doping, deposition, etc., the transistor structure is formed. Also, because of the higher mobility of electrons compared to holes in silicon, primarily power transistors of npn type are used for the aforementioned application. The current flow through the transistor structure is normally vertical, with a higher doped subcollector region at the bottom of the structure. Metallic interconnecting layers are formed higher up in the structure.

With respect to FIG. 1, by varying the degree of doping in the collector 104, the base terminals 101 and/or the emitter 102, it is possible to obtain different types of frequency response and breakdown characteristics. Different lateral/vertical geometries give rise to transistors with different current capacities.

Amplifying RF signals poses several operation and design restraints on a power transistor. In order to maximize the current gain at high frequencies, the transistor must be able to handle a rather high collector current. The base current running from the base terminals 101 to the emitter region 102 causes a potential drop in the base region 103 laterally along the emitter region 102. The forward bias of the emitter-base junction, $V_{be}(x)$ will therefore decrease towards the emitter center resulting in a crowding of the current density towards the emitter edges. This is demonstrated by the following formula:

$$I_c = I_o \left( e^{\frac{V_{be}(x)}{kT}} - 1 \right)$$

where $I_c$ is the collector current, $I_0$ is the base current, $V_{be}(x)$ is the laterally varying forward bias of the emitter-base junction, k is Boltman's constant, and T is temperature.

Current crowding is a common problem that occurs at higher current densities for bipolar transistors, which increases the peak current density at a given overall current. FIG. 1 illustrates the current crowding effect through a principal cross section of a bipolar transistor through the emitter and base region. The dashed lines represent the base current and the solid lines represent the collector current.

FIG. 2 illustrates a principal collector diagram, showing the quasi-saturation region 210 where a high collector current causes the base-collector junction to become locally forward biased, due to the induced voltage drop in the neutral collector region. The effect, e.g., increases net charges stored in the base region, thereby introducing non-linearity in the transistor characteristics and a lowering of the cut-off frequency. Entering the quasi-saturation region results in a harmonic distortion at high frequencies, due to the non-linear characteristics of the transistor in this operating area.

Conventional silicon bipolar power transistors use ballast resistors to limit the current entering each emitter finger. This use of ballast resistors result in the need for a higher supply voltage in order to maintain the biasing to the linear region of the transistor operating area as illustrated in FIG. 2. In addition, ballast resistors normally possess non-linear characteristics.

The following equation illustrates the relationship between $f_T$, $f_{max}$ and two of the more relevant transistor parasitics, $R_b$ and $C_{bc}$:

$$f_{max} = \sqrt{\frac{f_T}{8\pi R_b C_{bc}}}$$

where $f_{max}$ represents the maximum frequency for unity power gain of the transistor, $f_T$ is the frequency when the current gain of the transistor reaches unity, $R_b$ is the base resistance, and $C_{bc}$ is the capacitance of the base-collector junction. The base resistance, $R_b$ should be kept as low as possible since it affects the power gain at high frequencies. The base resistance is the resistance imposed on the base current during its path from the base contact to where the base current enters the emitter region.

The high current densities and output power of a conventional RF power transistor results in a temperature rise of the active chip area. The current gain of a conventional standard silicon bipolar transistor is thermally activated. At higher temperatures, the above situation becomes unstable and, if the current is not limited, destructive thermal runaway can occur. Using long emitter fingers or large area emitters results in a higher temperature rise in the center of the structure than close to the edges, since the heat dissipation is more limited at the center, thus further increasing the risk of thermal runaway. Since most conventional failure mechanisms are thermally activated, a high chip temperature should be avoided. Additionally, devices such as mobile telephones have limited cooling capabilities that add further constraints on the chip temperature.

As illustrated in FIG. 3, conventional silicon RF power transistors designed to handle large currents and high power levels are usually designed utilizing several emitter fingers of approximately 20–40 μm each. The whole transistor is then made up by connecting in parallel many transistor cells 310. Using long and narrow emitter fingers 311 helps to reduce the path for the base current to traverse.

Emitter ballast resistors 312 limiting the current to each emitter finger 311 is the conventional way of dealing with thermal runaway for conventional silicon bipolar transistors. The emitter ballast resistors 312 are attached one to each emitter finger 311. The emitter ballast resistors 312 are required to have a finite size that corresponds to the actual resistance value, thus limiting the number of emitter fingers 311.

Using long and narrow emitter fingers also introduces additional problems since at high current densities, potential drops arise along the metal contacts of long emitter fingers contacting the emitter regions, thereby further enhancing the current density locally, according to $$I_c = I_o \left( e^{\frac{V_{be}(x)}{kT}} - 1 \right)$$

as discussed above, i.e., the voltage drops decreases ($V_{be}$) thus decreasing the collector current locally.

The increased temperature for each emitter requires the distribution of the transistor cells over a large area in order to manage the localized heating by increasing the heat dissipating area. The additional wiring necessary to connect all cells in parallel therefore contributes to the transistor parasitics.

SUMMARY OF THE INVENTION

The present invention provides a new structure for a power transistor using the SiGe process that addresses the aforementioned problems. The power transistor of the present invention is generally intended, but not limited to, a low power supply (e.g., less than or equal to 5V), RF application. In an exemplary embodiment of the present invention, a power transistor includes a plurality of emitter regions and a plurality of base contacts. In order to decrease base resistance, each of the plurality of emitter regions is adjacent to at least four base contacts.

The entire transistor includes multiple emitter regions, e.g., greater than or equal to about 1,000 with no upper limit wherein the actual number of emitter regions is dependent on the desired current carrying capacity. The emitter regions are directly connected in parallel to the high current carrying metal layer of the transistor through vias or metal contact studs.

In an exemplary embodiment of the present invention, the dimension of an emitter region is 0.5×2.0 μm however, the size of the emitter regions should be made as small as process design rules will allow in order to allow an increase in the perimeter to area ratio of the emitter region which, for a given current, decreases the peak current density. The arrangement of the present invention is made practical by not using ballast resistors (which are needed in the conventional bipolar power transistors).

BRIEF DESCRIPTION OF THE DRAWINGS

The invention will be described in more detail in the following detailed description, with reference to the appended drawings, which are only shown to illustrate the invention and shall not in any way be taken to limit the scope of the invention, in which.

DETAILED DESCRIPTION

Figure 1:
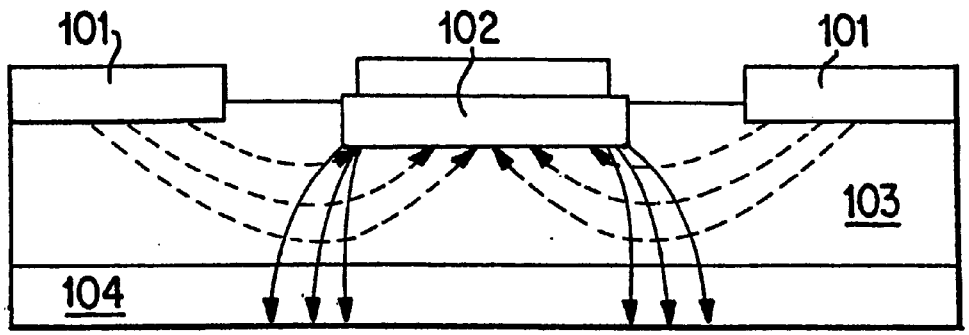
FIG. 1. illustrates the current crowding effect through a cross-section of a bipolar transistor.
Figure 2:
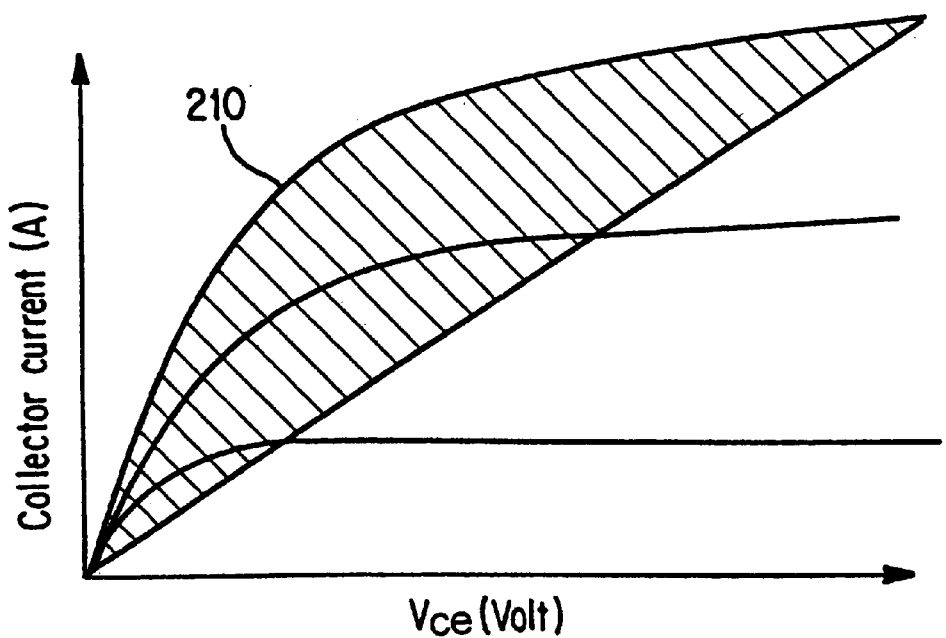
FIG. 2 illustrates a principal collector diagram.
Figure 3:
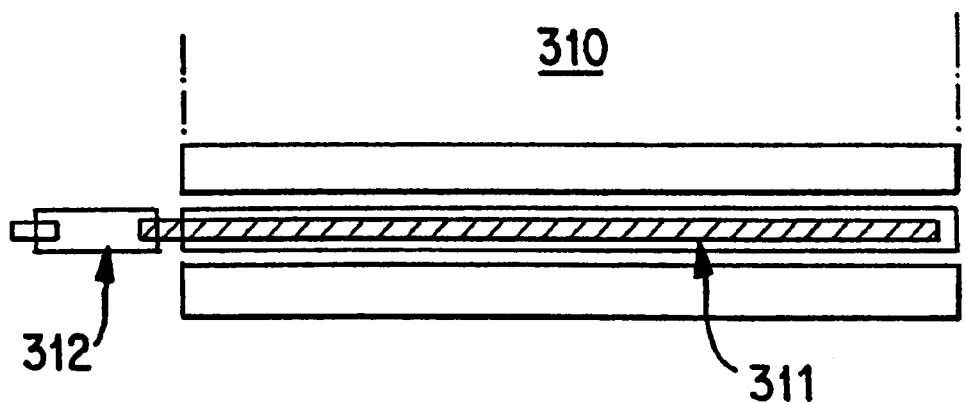
FIG. 3 illustrates a conventional power transistor cell.
Figure 4:
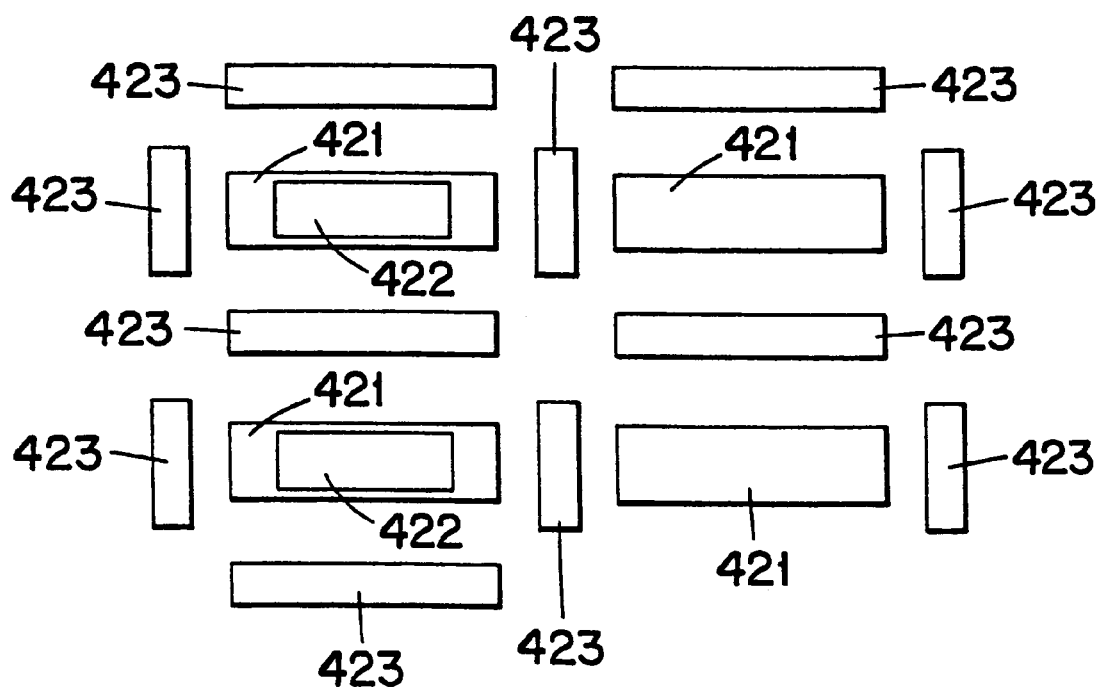
FIG. 4 illustrates a top-view of a portion of an exemplary transistor in accordance with the present invention.

FIG. 4 illustrates a principal outline of a portion of an exemplary transistor 420 of the present invention. The entire transistor includes multiple emitter regions 421, e.g., exceeding about 1,000, preferably as many as the minimum design rules allow. The emitter regions 421 are directly connected in parallel to the high current carrying metal layer (not shown) of the transistor through vias or metal contact studs 422. In an exemplary embodiment of the present invention, the power transistor 420 is produced from a SiGe Hetero Bipolar Technology Process which uses a base region made from SiGe.

The current gain for the SiGe hetrojunction bipolar transistors (HBT) has a current gain that is practically independent of temperature. This property makes the use of emitter ballast resistors unnecessary, since local thermal runaway is not physically feasible. For additional material on the properties of SiGe and a typical SiGe hetrojunction bipolar transistors (HBT) process, one is referred to D. L. Harame, *Si/SiGe Expitaxial-Base Transistors-Part I: Materials, Physics, and Circuits,* IEEE Trans.Electron Devices, Vol. 42, No. 3, 1995, the content of which is hereby incorporated by reference in its entirety.

As illustrated in FIG. 4, partitioning the emitter regions in several small areas, e.g., about 0.5×2.0 μm, which is made practical by omitting the use of ballast resistors, increases the perimeter to area ratio. This increase in perimeter to area ration thereby results in a higher collector current limit where quasi-saturation sets in. The transistor linearity is thereby increased.

In an exemplary embodiment of the present invention, the size of the emitter regions 421 should be made as small as the process design rules will allow in order to allow an increase in the perimeter to area ratio (e.g., greater than about four) of the emitter region 421 which, for a given current, decreases the peak current density.

In an exemplary embodiment of the present invention, each of the sides which make up the perimeter of an emitter region is adjacent to a base contact 423, such that base current is introduced on all four sides of the emitter region. By introducing current on all four sides of the emitter region, the base resistance is thereby decreased thus improving the power gain.

In addition, since in an exemplary embodiment of the present invention, the length of each emitter region 421 is much less than the length of a conventional emitter finger, the power generated below the emitter can be dissipated in an additional two more directions, thereby increasing power dissipation. This additional power dissipation produces a lower temperature rise in the emitter region 421. For example, as compared to a conventional emitter finger of 20 μm, the center to edge temperature rise for an emitter in accordance with the present invention with a length of about 2.0 μm is lowered by approximately a factor of two.

The present invention has been described with reference to exemplary embodiments. However, it will be readily apparent to those skilled in the art that it is possible to employ the invention in specific forms other than as described above without departing from the spirit of the invention. The embodiments described above are illustrative and should not be considered restrictive in any way. The scope of the invention is given by the appended claims, rather than the preceding description, and all variations and equivalents which fall within range of the claims are intended to be embraced therein.

We claim:

1. A transistor comprising:

a plurality of emitter regions connected in parallel;

a plurality of base contacts;

wherein each of said plurality of emitter regions is adjacent to at least four base contacts and wherein each of said plurality of emitter regions is separated from all other emitter regions by at least one base contact.

2. The transistor of claim 1, wherein said transistor is produced from a SiGe Hetero Bipolar Technology process.

3. The transistor of claim 1, wherein said transistor further comprises a base region, wherein said base region is made from SiGe.

4. The transistor of claim 1, wherein said plurality of emitter regions is greater or equal to 1,000.

5. The transistor of claim 1, wherein said length of each of said plurality of emitter regions is less than or equal to about 2 $\mu$m and wherein said width of each of said plurality of emitter regions is less than or equal to about 2 $\mu$m.

6. The transistor of claim 1, wherein said transistor is ballast resistor free.

7. The transistor of claim 1, wherein said transistor is a bipolar power transistor.

8. The transistor of claim 1, wherein said transistor is a RF power transistor.

9. The transistor of claim 1, wherein said transistor is operable at a low supply voltage.

10. The transistor of claim 1, each of said plurality of emitter regions has at least four sides which make up a perimeter of each said plurality of emitter regions and wherein at least one of said at least four base contacts is directly opposite each side.

11. The transistor of claim 1, wherein each of said plurality of emitter regions are about 0.5×2.0 $\mu$m, thereby having a perimeter to area ratio that results in a higher-collector current limit where quasi-saturation sets in.

* * * * *